United States Patent

[11] 3,562,609

[72] Inventors Arrigo Addamiano
Willoughby;
Lester M. Hertz, Euclid, Ohio
[21] Appl. No 734,303
[22] Filed June 4, 1968
[45] Patented Feb. 9, 1971
[73] Assignee General Electric Company
a corporation of New York

[54] SOLID STATE LAMP UTILIZING EMISSION FROM EDGE OF A P-N JUNCTION
5 Claims, 2 Drawing Figs.

[52] U.S. Cl. .......... 317/235, 317/234; 313/108
[51] Int. Cl. .......... H01l 15/00
[50] Field of Search .......... 317/237, 234/4, 235/27, 235/47, 234/27, 234, 235, 235/47.1, 234/1

[56] References Cited
UNITED STATES PATENTS

| | | | |
|---|---|---|---|
| 3,341,753 | 9/1967 | Cunningham | 317/234 |
| 3,343,026 | 9/1967 | Luechinger | 313/108 |
| 2,817,783 | 12/1957 | Loebner | 313/108 |
| 3,458,779 | 7/1969 | Blank | 317/234 |

*Primary Examiner*—John W. Huckert
*Assistant Examiner*—Martin H. Edlow
*Attorneys*—Henry P. Truesdell, Frank L. Neuhauser, Oscar B. Waddell, Norman C. Fulmer and Joseph B. Forman

ABSTRACT: The diffusion of P-type dopants into N-type silicon carbide in order to create junctions produces a surface layer of P-type material all over and around the silicon carbide platelet. By cutting the silicon carbide perpendicular to the plane of the platelet, PNP slices are obtained. When ohmic contacts are made to the opposite P-type layers and to the N-type core, light may be emitted edgewise from both junctions. The PNP double junctions can be connected for simultaneous operation on DC or for alternate operation on AC The N-type core is mounted on a header, and the edges of the P-type layers are recessed at the mounting surface so as to insulate the P-type layers from the header. In a method of making the lamp, a column of the N-type core, flanked by the P-type layers, is cut to form pairs of aligned transverse notches through the P-type layers, and the column is then severed at each pair of notches thus forming the aforesaid edge recesses of the P-type layers at the N-type core mounting surface.

Inventor:
ARRIGO ADDAMIANO
LESTER M. HERTZ
by [signature]
His Attorney

SOLID STATE LAMP UTILIZING EMISSION FROM EDGE OF A P-N JUNCTION

BACKGROUND OF THE INVENTION

The invention relates to light-emitting diodes which are also referred to as solid state lamps. Such devices comprise a chip or die from a silicon carbide platelet, or a platelet of other suitable light-emitting material, containing a PN junction. The N-type region of the crystal chip if silicon carbide, is nitrogen doped and the P-type region is boron and/or aluminum doped. In the commercially available devices, the chip is mounted P-side down on a header and light is emitted through the N-type topside which is contacted by a fine wire.

In the present state of the technology of silicon carbide lamp making, a flat platelet of green nitrogen doped silicon carbide is subjected to a diffusion process at high temperatures (1800 to 2600° C.) which creates a surface layer of P-type material all over and around the platelet. As the original crystal is N-type for the creation of a PN electroluminescent structure, it is necessary to expose once more the N-type part or core of the crystal. The current practice consists of grinding or lapping away one of the two large area P-type layers, that is one of the flat sides of the platelet, in order to expose the original N-type crystal core. The finished lamp comprises such a PN structure plus ohmic contacts to the P-layer and N-side, and the emitted light is seen through the flat surface of the green n-side. Reference may be made to the aforementioned Blank and Potter patent for further details on the construction of such silicon carbide lamps.

SUMMARY OF THE INVENTION

A light-emitting crystal junction when seen edge-on emits a narrow line of light corresponding to the edge of the junction. The brightness of the crystal seen edge-on is greater than when seen through the green N-type layer. For this reason, a construction in which the crystal is seen edge-on is preferable for certain applications, for instance for use in connection with an optical pickup. The invention provides a new and improved construction of solid state lamps for use in the edge-on position.

The lamp of the present invention can be operated on both DC and AC. Another feature of the lamp is that it can be used in connection with two independent light detectors.

In making a lamp according to a preferred embodiment of the present invention, after the diffusion of P-type dopants such as boron and aluminum which creates a P-type layer all around the crystal, the crystal or platelet is cut perpendicular to the plane of its flat side in order to obtain a set of PNP structure. The thickness of the slices or chips is not critical; for reasons of economy, the thickness may be the least which can be obtained in practice with a suitable cutting tool such as a diamond saw, for instance 0.2 mm. As for the width of the slices, this depends on the thickness of the original crystal platelet. However because the light emitted is seen edge-on, absorption of the 5900 A light emitted by the green N-type material is not a problem as it is with crystal chips seen face on. Consequently one can use both thin plates and relatively thick crystals or platelets. In a completed lamp, ohmic contacts are made to the opposite P-type layers and to the N-type core of the slice. In a preferred embodiment, the P-type layers are undercut and overhang the N-type base which is bonded to a header, thereby providing recessed edges to insulate the P-type layers from the header. A method of making the lamp comprises the steps of cutting the platelet to form columns of N-type core flanked by P-type layers, forming pairs of aligned transverse notches through the P-type layers, and severing the column at each pair of notches thereby providing electrically insulating undercuts or recesses in the P-type layers at a surface of the N-type core adapted for mounting on a header.

DETAILED DESCRIPTION

Figure 1:
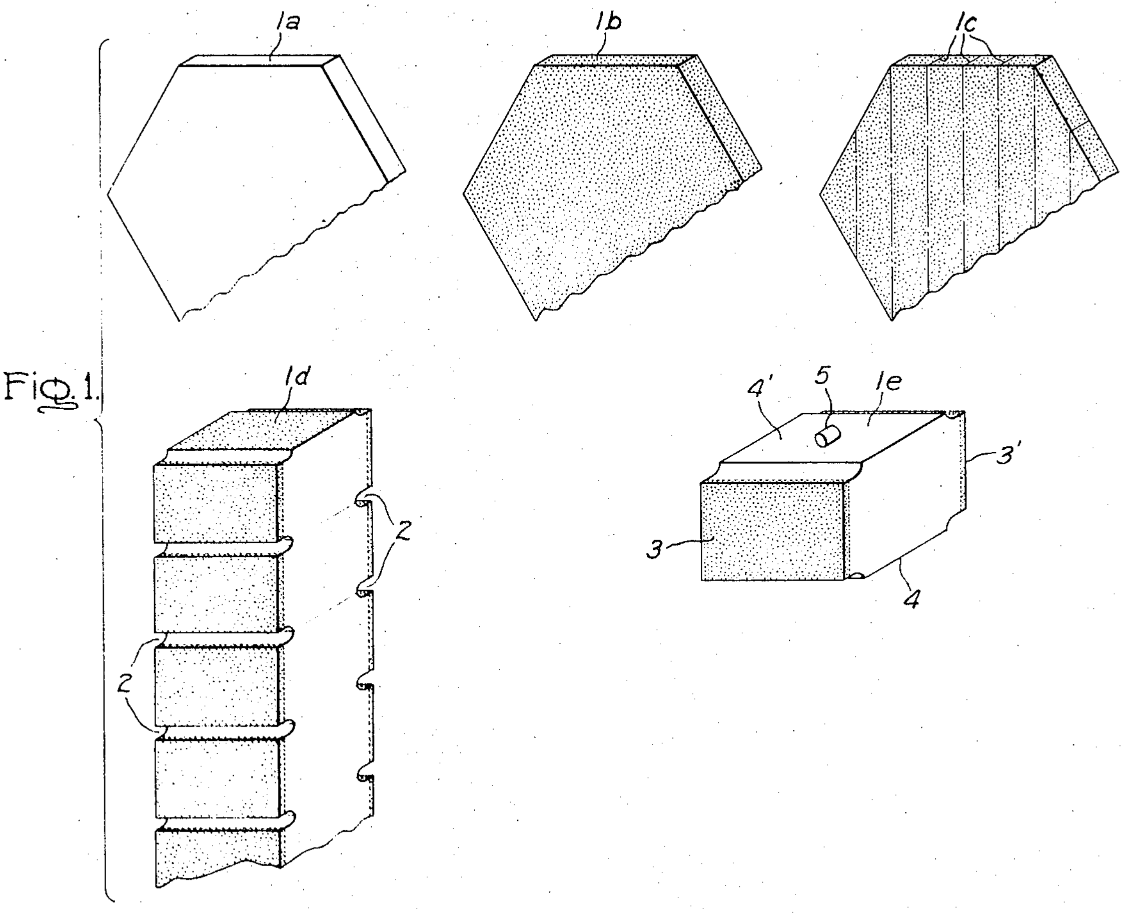
FIG. 1 illustrates successive stages in making a silicon carbide crystal or platelet into a light-emitting PNP junction.

The silicon carbide single crystal or platelet consists of green nitrogen-doped alpha SiC which may be prepared by the Lely technique. The crystal is ground flat and polished, suitably with a metal bonded diamond lap, and plane surfaces obtained perpendicular to the c-axis, as shown at *1a* in FIG. 1. Typically the crystal is a platelet well-formed as a hexagon on four sides; it may be 5 to 10 mm. across by 0.5 to 1.5 mm. thick. Boron and aluminum are diffused into the crystal at high temperature, preferably in the manner described in the aforementioned Blank and Potter patent, in order to make a junction. Diffusion creates a P-type surface layer, typically 0.1 to 10 microns thick, on both faces of the platelet as shown at *1b* by stippling.

The next step according to the preexisting practice, has been to grind off the P-layer on one side of the crystal in order to expose the original N-type core material. In accordance with our invention, the P-type layer is not ground off but is allowed to remain on both sides of the crystal. The platelet may then be cut through along parallel lines such as shown at *1c* in order to form relatively long strips or columns. Typically a column may be 1 x 1 x 8 millimeters long as shown at *1d*. The top of the column which is P-type may be ground off to expose the cross section. The column is then cut part way through or notched transversely on opposite sides as shown at 2, the notches penetrating deeper than the P-layer. The column is then broken into chips or slices as shown at *1e*, each being a PNP structure. The fractures occur along the medial line of the notches so that the P-layer regions 3, 3' overhang the base 4 on each side and do not extend vertically as far as the base 4 (or top 4') of the core of the chip which is N-type The thickness or vertical dimension of the chips or slices as shown at *1e* may be the least which can be obtained in practice with a suitable cutting tool such as a diamond saw, for instance 0.2 mm. The width of the structure or slice depends of course on the thickness of the original crystal or platelet, typically 0.5 to 1 mm. The emitted light is seen edge-on as a narrow line of light where the P-type material changes over into N-type, and there are two such lines, one for each P-layer. Absorption of the emitted light within N-type material is therefore not a problem so that both thin platelets and relatively thick crystals may be used. Of course there may be practical limits to how thin a crystal may be used due to the difficulty of making contact to the N-region and also the practical problem of handling such tiny bits of material.

Once the p-n-p slices are cut, an ohmic contact may be made to the n-type core by fusing a small piece of metal or alloy suitably a short length 5 of wire, to one of the n-surfaces of the chip, either base 4 or top 4' as shown, to provide a conductive dot contact. The preferred material for the dot is a gold tantalum alloy. Alternatives are nickel, nickel chromium alloy, niobium and vanadium, any of which may be alloyed with gold.

Figure 2:
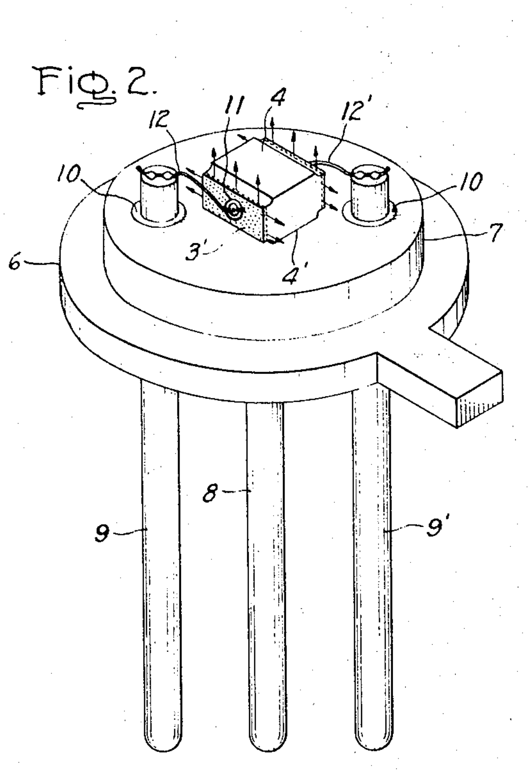
FIG. 2 illustrates a silicon carbide PNP light-emitting diode or lamp embodying the invention.

To make a solid state lamp, a single chip *1e* may be mounted on a transistor type header 6 shown in FIG. 2. The header comprises a gold-plated base disc 7 of Kovar, a nickel-cobalt-copper alloy having a coefficient of expansion substantially matching that of silicon carbide. Ground lead wire 8 is attached to the underside of the base disc and two other lead wires 9, 9' project through the disc but are insulated therefrom by sleeves 10.

To mount the crystal chip on the header, the chip is placed with one of the fractured sides, suitably top 4', down upon the header and with a gold-tantalum dot in between. The dot may have previously been fused to the chip but this is not essential. The chip and header are heated in a neutral atmosphere and desirably the chip is simultaneously pressed down upon the header while the temperature is raised sufficiently to cause the gold-tantalum dot to bond to the gold-plated header surface.

After cooling, a spot of aluminum-silicon resinate paint wherein the aluminum and silicon are preferably in eutectic proportions is applied to each P-surface 3, 3' of the crystal which are perpendicular to the plane of the header disc. Upon heating in air to about 400° C, the resin decomposes and a shiny spot 11 of Al–Si eutectic forms on each p-layer. A conductive cement, suitably a gold-filled epoxy cement, is then painted over the Al–Si spot on each side of the chip. Soft metal wires 12, 12' suitably of gold, are bonded, for example by thermocompression bonding, to the top of the lead wires 9, 9' projecting through the disc and are led into the conductive cement on each side of the chip. Upon setting of the cement, the lead wires 9, 9' are electrically connected to the two P-sides of the PNP slice. The uninsulated lead 8 is connected to the N-type core which is bonded by fused metal to the header. This mounting assures that the vertical p-surfaces 3, 3' do not contact the header.

On application of a DC or AC low voltage, light is emitted as indicated by the arrows in FIG. 2 and can be observed as pairs of narrow bright lines extending along the boundaries of the P-type material on each side of the chip and separated by the width of the N-type material. On DC operation, the P-side leads 9, 9' can be connected separately or in parallel. By making separate connections to the leads, the two PN junctions may be used independently. In low voltage AC operation, at high frequencies the junctions will appear to be both on all the time. At low frequencies, it is possible to see one junction on while the other is off and observe the alternating operation or flicker. When the leads are connected together so that the junctions are in parallel and they are operated on DC, more light is emitted of course than would be if only one junction were present.

We claim:

1. A solid state lamp comprising a semiconductor crystal chip of N-type material having P-type surface layers on a pair of opposite faces thereof, an electrically conductive header comprising a mounting surface larger than a PNP surface of said crystal chip and having insulated leads, said crystal chip being mounted on said header with the N-type face of said PNP surface in contact with said mounting surface and the P-type faces standing up over, perpendicular to, and spaced from said mounting surface, ohmic contacts on said P-type faces, and electrical connections respectively between said contacts and said insulated leads of said header.

2. A lamp as in claim 1 wherein the edges of said P-type surface layers are recessed adjacent to said mounting surface so as to be spaced therefrom.

3. A lamp as in claim 2 wherein said material is silicon carbide, wherein fused metal bonds said N-type face to the header mounting surface, and wherein said electrical connections from the insulated leads to the P-layers are made by fine wires cemented to the P-faces by conductive cement.

4. A solid state lamp comprising a semiconductor crystal chip having a plurality of regions of opposite conductivity arranged in layers to form at least one PN light-emitting junction, a face of said crystal chip that is perpendicular to said junction being adapted for mounting of said chip, the edge of at least one of said regions being recessed at said face so as to be spaced from the plane of said face, an electrically conductive header having a mounting surface thereon larger than said mounting face of the crystal chip, said crystal chip being mounted on said header with said mounting face thereof in contact with said mounting surface, whereby said recessed regions of the chip are positioned over, spaced from, and out of electrical contact with said mounting surface of the header, and means providing electrical connections to said partly cut away regions of the crystal chip.

5. A lamp as claimed in claim 4, wherein said crystal chip is composed of silicon carbide.